United States Patent [19]
Boe

[11] Patent Number: 6,014,901
[45] Date of Patent: *Jan. 18, 2000

[54] EXTRACTION FORCE TESTER

[75] Inventor: Craig L. Boe, Nampa, Id.

[73] Assignee: Micron Electronics, Inc., Boise, Id.

[ * ] Notice: This patent is subject to a terminal disclaimer.

[21] Appl. No.: 09/072,273

[22] Filed: May 4, 1998

Related U.S. Application Data

[60] Continuation of application No. 08/851,467, May 5, 1997, which is a division of application No. 08/769,786, Dec. 18, 1996, Pat. No. 5,731,525.

[51] Int. Cl.[7] ........................................ G01N 3/08
[52] U.S. Cl. ................................. 73/831; 73/826
[58] Field of Search ........................... 73/826, 830, 831, 73/834, 856

[56] References Cited

U.S. PATENT DOCUMENTS

| | | | |
|---|---|---|---|
| 4,110,880 | 9/1978 | Peppler et al. | 29/33 K |
| 4,292,852 | 10/1981 | Morris | 73/827 |
| 4,753,115 | 6/1988 | Moody | 73/826 |
| 4,895,028 | 1/1990 | Mayer | 73/827 |
| 4,896,339 | 1/1990 | Fukumoto | 377/19 |
| 5,357,814 | 10/1994 | Sugiyama | 73/865.9 |
| 5,458,500 | 10/1995 | Aikawa | 439/310 |
| 5,582,523 | 12/1996 | Noro et al. | 439/310 |
| 5,731,525 | 3/1998 | Boe | 73/826 |

*Primary Examiner*—Max Noori
*Attorney, Agent, or Firm*—Knobbe, Martens, Olson & Bear, LLP

[57] ABSTRACT

An extraction force tester which measures the force necessary to remove header pins from the sockets of a cable connector in a steady straight line motion, the extraction force tester includes: a base, a tensile force gauge slidably mounted to the base and a pin assembly slidably mounted in relation to the base such that the pin assembly may slide independently of the tensile force gauge. The pin assembly has a specified number of pins, e.g., twelve, for engaging the sockets of a connector. The extraction force tester further excludes a coupler for coupling the pin assembly to the tensile force gauge such that the force gauge may push the pin assembly in a first direction, to allow the pins of the pin assembly to engage the sockets of the connector, and pull the pin assembly in a second direction, opposite to the first direction, to disengage the pins from the sockets, thereby allowing the force gauge to measure the extraction force necessary to disengage the pins from the sockets.

12 Claims, 7 Drawing Sheets

EXTRACTION FORCE TESTER

RELATED APPLICATIONS

This application is a continuation, under 37 C.F.R. §1.53(b), of U.S. application Ser. No. 08/769,786, also entitled, "Extraction Force Tester," and filed on Dec. 18, 1996.

BACKGROUND OF THE INVENTION

1. Field of the Invention

The present invention relates to quality control testing of cable connectors. More particularly, the present invention provides a method and apparatus for testing the cable spring force, or the extraction force, of a cable connector.

2. Description of the Related Art

Cable connectors provide the connections between devices such as a hard disk drive, a floppy disk drive, and a motherboard of a personal computer, which must communicate electrical signals, or data, between one another. Typically, a "female" connector, having multiple sockets in a predetermined number, spacing and configuration mates with a "male" connector having multiple pins which match the number, spacing and configuration of the sockets. The pins of the male connector engage the sockets of the female connector and thereby provide multiple electrical connections between the electronic devices attached to each respective connector. These connections enable data and information, in the form of electrical signals, to be communicated between the respective devices. In order to ensure the proper operation and communication of information between such devices, strong and reliable connections must be provided by the cable connectors. Therefore, in the cable connector manufacturing industry, and in other industries in which cable connectors are used, the quality of the cable connectors is of paramount concern.

Cable connectors provided by well-known cable connector manufacturers such as 3M and AMP have a reputation for reliability and quality in the industry. These cable connectors are typically factory tested and, therefore, do not need to be further tested by, for example, an end user for quality assurance. However, many new or smaller cable connector manufacturers have emerged, which manufacture what are commonly known in the industry as "generic cable connectors." Since many of these manufacturers do not factory test their cable connectors, a fast and efficient method and apparatus for testing the quality and reliability of these generic cable connectors is necessary. Also, since there are various types of cable connectors, having differing force specifications and connection configurations, a method and apparatus which can accommodate these different types of cable connectors and measure the various extraction force ranges associated with each type of cable connector is needed. As used herein the term "extraction force" refers to the force necessary to extract a specified number of header pins from the sockets of a cable connector.

These smaller cable connector manufacturers, many of which are located over-seas from the United States, typically do not provide or list the values of the extraction force strength for each cable connector design. Since basic designs and materials can vary from manufacturer to manufacturer, it is necessary to measure the extraction forces of these various cable connectors to ensure the quality and reliability of the products made with such connectors.

Historically, cable connectors from well known manufacturers such as 3M and AMP have worked reliably in most applications. However, generic cable connectors are typically much less expensive than the cable connectors manufactured by such well known companies. Therefore, if end-user quality control tests can be efficiently implemented on such generic cable connectors, product manufacturers who use such generic cable connectors can achieve the same results at a much lower cost.

In addition, there is presently no standardized method and/or apparatus, of which the Applicant is aware, for testing cable connectors, such that quality assurance tests performed by one company or vendor would be meaningful to another company or vendor. Therefore, a method and apparatus for testing the extraction force values of cable connectors, which may be easily and conveniently implemented by many vendors is needed to standardize quality control testing of cable connectors in the industry. By reporting the measured extraction force value of a particular type of cable connector, or by providing the measured extraction force values of a sampling of cable connectors within a particular shipment, using a standardized or well-known testing method and apparatus, cable connector vendors can provide reliable quality control statistics to their customers.

SUMMARY OF THE INVENTION

The present invention addresses the above and other needs by providing an extraction force tester which measures the force necessary to remove header pins from the sockets of a connector. Connector spring force, otherwise referred to as the extraction force, is measured by withdrawing a plurality of pins from the pin sockets of the connector in a steady, straight line motion. After disengagement of the pins from the sockets, an electronic tensile force gauge reads the maximum tensile force needed to remove the plurality of pins from the plurality of sockets of the connector. Although the extraction force tester of the present invention is typically used to perform quality control tests for cable connectors, it should be understood that the method and apparatus of the present invention may be used to test the extraction force necessary to disengage pins, plugs, or other types of structures which are matingly received, held, or otherwise coupled to other types of connectors, devices, apparatus or structures.

In order to provide a control process in which the extraction force of each of the various types of cable connectors can be measured, a method and apparatus is provided which measures the extraction force value of a sampling of various cable connectors from manufacturers who perform in-house quality control tests such that their connectors have commercially acceptable extraction force characteristics. By using these selected cable connector sample values as reference values, one can determine an acceptable extraction force range for the quality control testing of other generic cable connectors.

In one embodiment, the extraction force tester of the present invention measures the tensile load needed to remove a selected number of header pins e.g., twelve, from a stationary cable connector. By dividing the measured tensile load by twelve, the tensile load per pin can be determined. This extraction force tester includes a base, an electronic tensile force gauge slidably attached to the base and a pin assembly slidably mounted in relation to the base such that the pin assembly may slide independently of the electronic tensile force gauge. The pin assembly includes the pins for engaging the sockets of the connector.

The extraction force tester further includes a coupler for coupling the pin assembly to the electronic tensile force gauge such that the force gauge may push the pin assembly in a first direction to allow the pins of the pin assembly to engage the sockets of the connector.

The coupler also allows the electronic tensile force gauge to pull the pin assembly in a second direction, opposite to the first direction, to disengage the pins from the sockets, thereby allowing the tensile force gauge to measure the extraction force necessary to disengage the pins from the sockets.

In another embodiment, the extraction force tester of the present invention includes: a base, a first linear ball slide having a first stationary member mounted to the base and a first mobile member slidably engaging the first stationary member. The extraction force tester further includes a second linear ball slide having a second stationary member mounted on top of the first mobile member of the first linear ball slide and a second mobile member slidably engaging the second stationary member. The extraction force tester further includes a third linear ball slide having a third stationary member mounted on the base and a third mobile member slidably engaging the third stationary member such that the third mobile member slidably rides on top of the third stationary member in a direction lateral to the direction of motion of the first and second mobile members.

An electronic tensile force gauge is mounted on the first mobile member for measuring the force required to extract a specified number of pins from a connector and a pin assembly is mounted on the second mobile member. The pin assembly has a plurality of pins for engaging the sockets of a connector to be tested. The extraction force tester further includes a coupler for coupling the pin assembly to the electronic tensile force gauge such that the force gauge may push the pin assembly in a first direction, to allow the pins of the pin assembly to engage the sockets of the connector. The coupler also allows the electronic tensile force gauge to pull the pin assembly in a second direction, opposite to the first direction, to disengage the pins from the sockets, thereby allowing the tensile force gauge to measure the extraction force necessary to disengage the pins from the sockets. A connector stage, for receiving and holding the connector to be tested is mounted on the third mobile member, and a clamping device, mounted on the connector stage, clamps the connector to the connector stage, holding the connector firmly in position so that the pins of the pin assembly may engage and disengage the plurality of sockets in the connector.

In yet another embodiment, the present invention may be characterized as a method of measuring the extraction force, or connector spring force, of a female cable connector having multiple sockets therein. Such method includes the steps of first, installing a female connector onto a connector stage. Next, a plurality of pins of a pin assembly is moved in close proximity to the sockets of the connector, but do not engage the sockets. Next, the female connector is aligned such that its sockets may properly receive the pins of the pin assembly and the pin assembly is also aligned such that its pins may properly engage the sockets of the female connector. The pins of the pin assembly are then fully inserted into the sockets. The electronic tensile force gauge reading is set to "zero" and the force gauge is then pulled away from the female connector, thereby extracting the pins of the pin assembly from the sockets of the female connector. While the electronic tensile force gauge is being pulled away from the female connector, it measures the peak tensile force required to extract the pins from the sockets.

With the use of the apparatus and method of the present invention, the quality of, for example, a typical floppy drive cable connector, hard disk drive cable connector, or SCSI cable connector can be measured. An operator first places the cable connector onto the connector stage which positions and holds it firmly in place by means of a clamping device. Then the pin assembly, coupled to a digital force gauge, is moved toward the cable connector such that the pins of the pin assembly may engage the sockets of the cable connector. In a preferred embodiment, the position and alignment of the pin assembly is also adjustable by means of an adjustable bracket which holds the pin assembly. After the pins of the pin assembly are fully aligned with the sockets of the connector, the pins are fully engaged into the connector and then slowly disengaged from the connector. While the pin assembly is being moved away from the cable connector, thereby disengaging the pins from the sockets, the electronic tensile force gauge is measuring the force required to pull the pins out of the sockets. The extraction force, or connector spring force, of the cable connector is given by the peak tensile force measured by the electronic tensile force gauge.

Thus, the present invention provides a fast and efficient method and apparatus for testing the quality and reliability of many different types of cable connectors which may have differing force specifications and connection configurations. The present invention is able to accommodate these different types of cable connectors and measure the various extraction force ranges associated with each type of cable connector. By providing an easy and reliable method of testing cable connectors, a customer who purchases cable connectors, for example, from a "generic" cable manufacturer, can be assured that such cable connectors meet specified quality standards. By providing reliable quality control for such cable connectors, product manufacturers who use these cable connectors can dramatically reduce their manufacturing costs.

Furthermore, the present invention provides a method and apparatus by which cable connector manufacturers can test their cable connectors in order to meet quality control specifications required by their customers. By testing these cable connectors using the method and apparatus of the present invention, both vendors and their customers can have a common and accepted method of reporting meaningful extraction force test results which can be assessed and evaluated to determine the quality and reliability of the cable connectors.

BRIEF DESCRIPTION OF THE DRAWINGS

The above and other aspects, features and advantages of the present invention will be more apparent from the following more detailed description thereof, presented in conjunction with the following drawings wherein.

DETAILED DESCRIPTION OF THE PREFERRED EMBODIMENT

The following description presents the best mode presently contemplated for carrying out the invention. This description is not to be taken in a limiting sense, but is made merely for the purpose of describing the general principles of the invention. The scope of the invention should be determined with reference to the claims.

Figure 1:
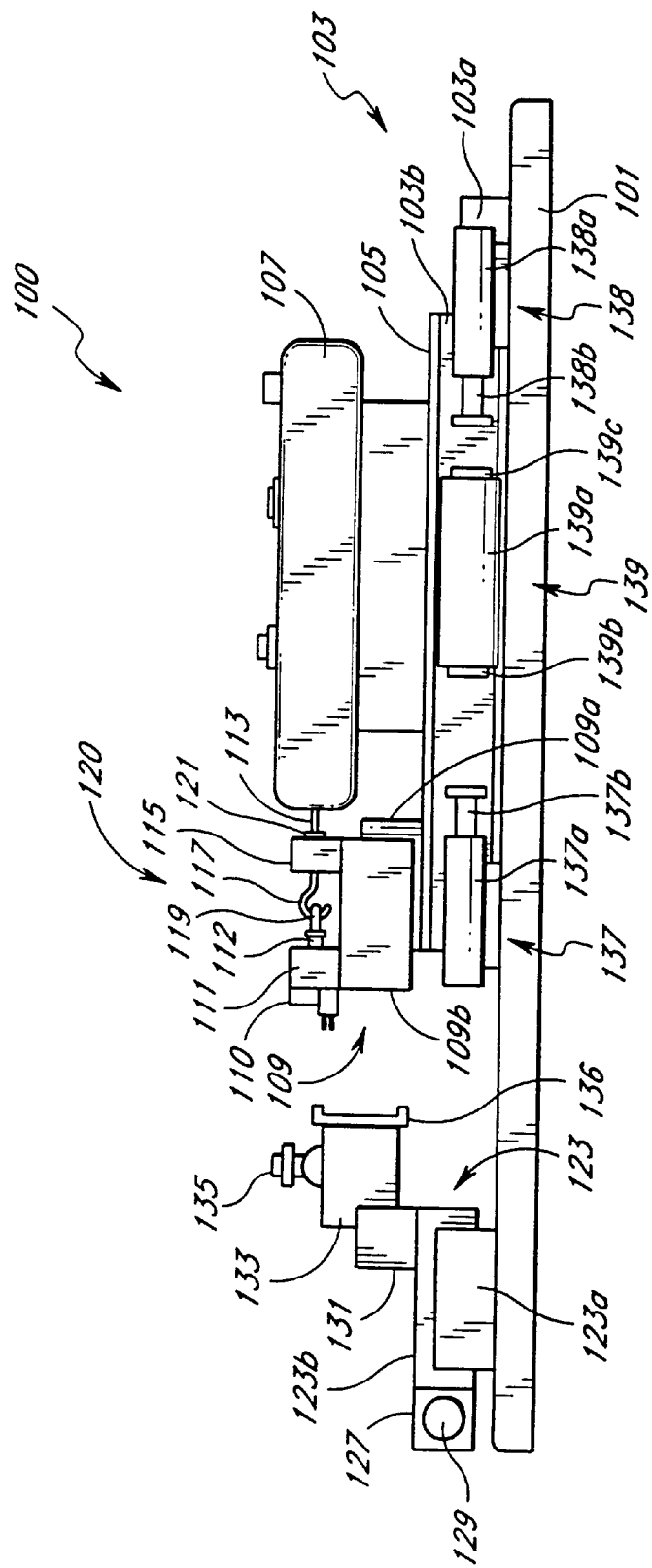
FIG. 1 is a left side, elevational view of a preferred embodiment of an extraction force tester in accordance with the present invention.

Referring to FIG. 1, there is shown an extraction force tester 100 in accordance with the present invention. The extraction force tester 100 includes a base 101 which may be cut, molded or cast from various metals or other suitable solid materials, and in the preferred embodiment is made from aluminum. A first linear ball slide 103 includes a first stationary member 103a which is mounted on a top face of the base 101. Slidably engaging the first stationary member 103a is a first mobile member 103b upon which a mounting plate 105 is mounted. The first mobile member 103b slidably engages the first stationary member 103a in a manner that will be described in greater detail below with reference to FIGS. 3A and 3B. The mounting plate 105 is attached to the top of the first mobile member 103b so that various devices and or structures, e.g., an electronic tensile force gauge, may be mounted on top of the mounting plate 105, thereby being indirectly mounted to the first mobile member 103b without affecting the mobility or operation of the first mobile member 103b as it slides on top of the first stationary member 103a.

As shown in FIG. 1, an electronic tensile force gauge 107 is mounted on the top surface of the mounting plate 105, thereby being movably coupled to the base 101. Electronic tensile force gauges are commercially available for a variety of uses and are well-known in the art. Many of these electronic force gauges incorporate state of the art microprocessors, precision load cells and liquid crystal displays to provide accurate (±0.5%) tension and compression measurements. These electronic tensile force gauges typically include a sensing head which may be used for both tension and compression testing. In one preferred embodiment, the electronic tensile force gauge is an ACCU-FORCE CADET force gauge, manufactured by AMETEK.

A second linear ball slide 109 includes a second stationary member 109a which is mounted on the top surface of the mounting plate 105 at an end opposite the end where the electronic tensile force gauge 107 is mounted. Slidably engaging the second stationary member 109a is a second mobile member 109b. The manner in which the second mobile member 109b slidably engages the second stationary member 109a will be described in further detail below with reference to FIGS. 3A and 3B.

A pin assembly 110 is attached to the second mobile member 109b via a bracket 111 which is mounted onto a top surface of the second mobile member 109b. Therefore, pin assembly 110 is also movably coupled to the base 101 and has separate, independent linear mobility with respect to force gauge 107. The bracket 111 adjustably holds the pin assembly 110 by means of two thumb screws 112 that extend through the bracket 111 and threadably engage the pin assembly 110. The structure and operation of bracket 111 and thumb screws 112 will be described in further detail with reference to FIG. 6. The electronic tensile force gauge 107 includes a sensing head 113 which extends outwardly from the end portion thereof as shown in FIG. 1. The sensing head 113 is connected to a load measuring mechanism (not shown) contained within the electronic tensile force gauge 107 so as to communicate mechanical loads placed on the sensing head 113 to the load measuring mechanism inside the force gauge 107. A coupling assembly 120 comprises a hook 117 threadably connected to the sensing head 113. The hook 117 extends through a coupling block 115 and hooks an eyelet 119 which is threadably connected to the bracket 111. As shown in FIG. 1, the coupling assembly further includes a washer 121 which is threadably attached around the hook 117 at the point where the hook 117 is connected to the sensing head 113 and to the right of the coupling block 115 which is mounted on the top surface of the second mobile member 109B. This coupling assembly 120 couples the electronic force gauge 107 to pin assembly 110 such that the force gauge 107 can use the pin assembly 110 to engage a connector to be tested and pull the pin assembly 110 away from the connector to measure the force necessary to extract the pins of pin assembly 110 from the sockets of the connector.

Additionally, the coupling assembly allows the force gauge 107 not only to pull the pin assembly 110 away from a connector, but also allows the force gauge 107 to push the pin assembly 110 toward the connector, thereby allowing the pins of the pin assembly 110 to engage the sockets of the connector. The coupling assembly described above is uniquely designed to prevent the creation of pseudo forces which can be caused by extraneous forces between the pin assembly 110 and the force gauge 107, such as forces occurring when the force gauge 107 is not axially aligned with the pin assembly 110. Such pseudo forces can cause inaccurate extraction force readings. The structure and operation of this coupling assembly will be explained in greater detail with reference to FIG. 6.

The first linear ball slide 103 and the second linear ball slide 109 provide linear mobility for the electronic tensile force gauge 107 and the pin assembly 110, respectively so that they may slide to the left and to the right, as shown in FIG. 1, in order for the pins of pin assembly 110 to engage and disengage the sockets of a connector. The force gauge 107 is coupled to the pin assembly 110 and measures the force required for such disengagement. The second linear ball slide 109, is mounted on the top surface of mounting plate 103, which in turn is mounted on top of the first linear ball slide 103, and provides for additional linear mobility of the pin assembly 110 which is independent of the linear mobility of the electronic tensile force gauge 107. The independent motion of the pin assembly 110 with respect to the electronic tensile force gauge 107 is necessary for the force gauge 107 to accurately measure the force necessary to pull back pin assembly 110. As can be appreciated, if the motion of pin assembly 110 were not independent of the motion of the tensile force gauge 107, there would be no tension between the pin assembly 110 and the force gauge 107 for the force gauge 107 to measure. The structure and operation of the first linear ball slide 103 and the second linear ball slide 109 will be described in greater detail with reference to FIGS. 3A and 3B.

The extraction force tester 100 also includes a third linear ball slide 123 having a third stationary member 123a mounted on the top surface of the base 101 at an end opposite to the first linear ball slide 103. A third mobile member 123b slidably engages the third stationary member 123a, riding on top of the third stationary member 123a. The manner in which the third mobile member 123b slidably engages the third stationary member 123a will be described in greater detail below with reference to FIGS. 3A and 3B. The third linear ball slide is mounted on base 101 such that the third mobile member 123b may slide in a direction lateral to the direction of motion of the first and second linear ball slides 103, 109. This direction is in and out of the paper when the device is oriented as shown in FIG. 1.

A mounting block 131 is attached to the upper surface of the third mobile member 123b such that an edge of the block 131 is substantially aligned with and extends along the right edge of the third mobile member 123b as shown in FIG. 1. A connector stage 133 is mounted on the top surface of the mounting block 131 for holding a connector to be tested (not shown). The connector stage 133 secures the connector in position for connection with the pins of pin assembly 110. The lateral position of the connector stage 133 may be adjusted to place a connector secured thereon in alignment with the pin assembly 110 such that when the pin assembly 110 is advanced toward the connector stage 133, the sockets of the connector will matingly receive the pins of the pin assembly 110. Attached to the top of the connector stage 133 is a pair of toggle clamps 135 for holding a connector, placed on top of the connector stage 133, in position on the connector stage 133. The structure and operation of the connector stage 133 in conjunction with the toggle clamps 135 will be described in greater detail below with reference to FIG. 7.

The lateral mobility of the third linear ball slide 123 allows a connector which is placed on the connector stage 133 to be properly aligned in the lateral direction so that the pins of pin assembly 110 will engage the sockets of the connector without being skewed. A slide wall 127 is connected to the third mobile member 123b at the far end of the third mobile member 123b and along its left edge so as to control the lateral movement of the third mobile member 123b. The lateral motion of the third mobile member 123b, which is slidably mounted on the third stationary member 123a, is controlled by a thumb screw 129 which extends through a hole (not shown) in the slide wall 127. The thumbscrew 129 is rotatably received at one end by a biasing wall 128 (not shown) which holds the thumbscrew 129 in a laterally fixed position while allowing it to rotate. The structure and operation of the thumbscrew 129 in conjunction with the biasing wall 128 will be described in greater detail with reference to FIG. 4. The thumbscrew 129 is threadably received by the hole of the slide wall 127 such that when the thumbscrew 129 is rotated it drives the slide wall 127 connected to the third mobile member 123b in a direction lateral to the direction of motion of the first and second linear ball slides, 103 and 109 (either toward or away from biasing wall 128 as shown in FIG. 4). The structure and operation of the third linear ball slide 123 will be described in greater detail with reference to FIGS. 3A, 3B and 7.

As shown in FIG. 1, a unique azimuth control 136 is slidably attached to the right side of the connector stage 133. The azimuth control 136 adjusts the azimuth angle, i.e., the "tilt angle," of the connectors mounted on connector stage 133 such that the alignment of the sockets of the connectors may be further refined to engage the pins of pin assembly 110. By adjusting the azimuth control 136 up and down, the "tilt angle" of a connector which has a front edge resting on top of the azimuth control 136 is thereby adjusted in order to be in proper alignment with the pins of pin assembly 110. In a preferred embodiment, the azimuth control 136 is slidably connected to connector stage 133 by means of a channel (not shown) formed in the left side of the azimuth control 136 (as shown in FIG. 1) for slidably receiving a guide rail (not shown) extending from the right side of the connector stage 133. Although the position of the azimuth control 136 may be manually adjusted, friction between the channel of the azimuth control 136 and the guide rail of the connector stage 133 is sufficient to securely maintain the azimuth control 136 in a fixed position during testing of a connector. As can be appreciated, the combination of connector stage 133, toggle clamps 135 and azimuthal control 136 allows for many different types, sizes and shapes of cable connectors to be accommodated by the extraction force tester 100 of the present invention.

Although the present invention has been described above with reference to specific embodiments, it should be appreciated that numerous changes or modifications can be made by one of ordinary skill in the art without departing from the scope of the invention disclosed herein. For example, it is apparent that the positions of the connector stage and the pin assembly may be reversed such that the connector stage is coupled to the force gauge and is moved in conjunction therewith to engage the pin assembly. Additionally, a modification to the embodiment disclosed above may be made such that the connector stage, the pin assembly, and/or the force gauge do not have to be coupled to a common base.

Figure 2:
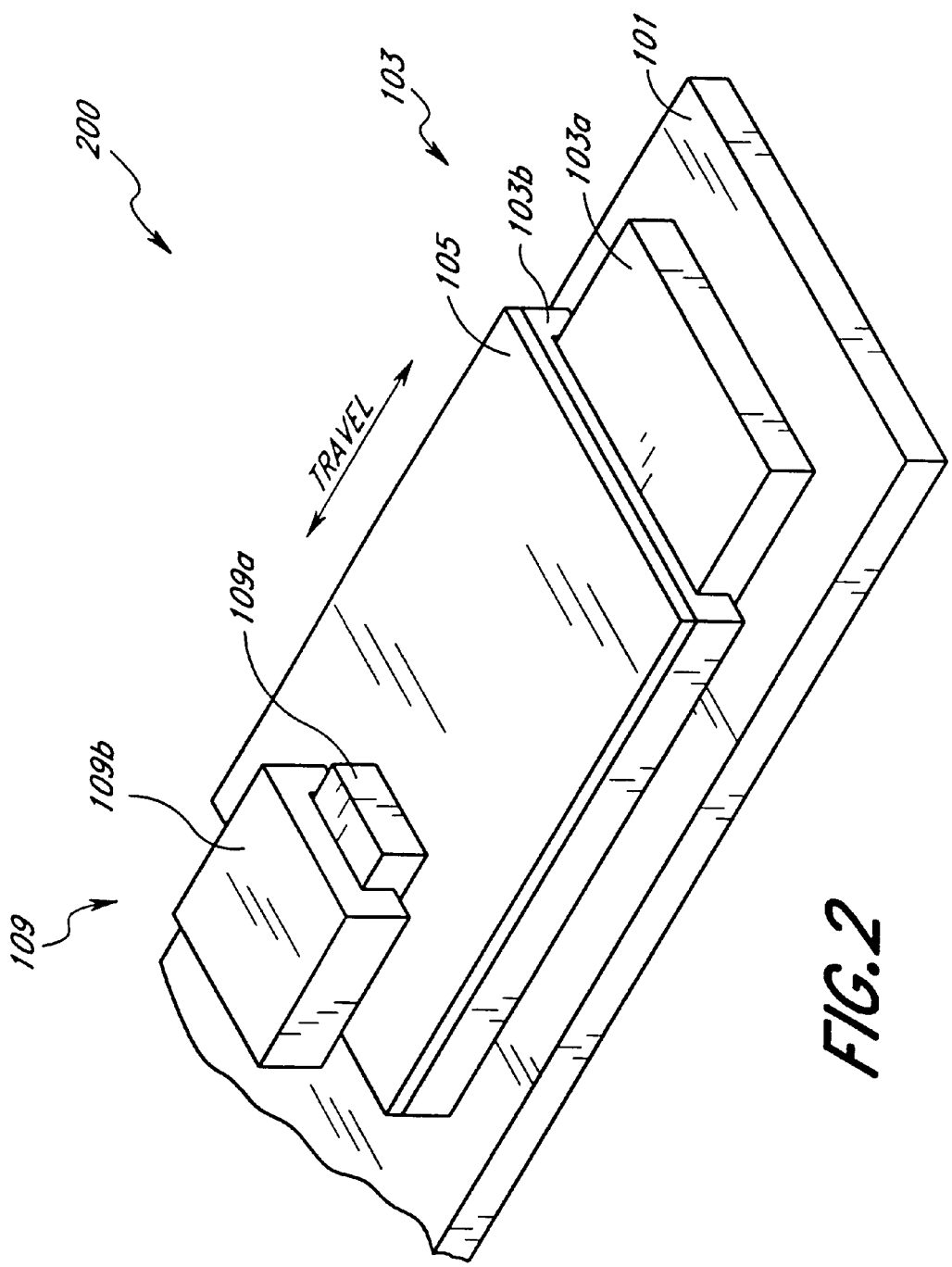
FIG. 2 is a perspective view of one embodiment of a linear ball slide system for use in the present invention.

FIG. 2 shows a perspective view of a linear ball slide system 200 which is used in the preferred embodiment of the extraction force tester 100 of the present invention. This linear ball slide system 200 includes the first linear ball slide 103 having the first stationary member 103a and the first mobile member 103b which slidably engages the first stationary member 103a, riding on top of the first stationary member 103a. The linear ball slide system 200 further includes the second linear ball slide 109 having the second stationary member 109a and the second mobile member 109b which slidably engages the second stationary member 109a, riding on top of the second stationary member 109a.

As shown in FIG. 2, the first stationary member 103a of the first linear ball slide 103 is mounted onto the base 101. The first stationary member 103a is essentially a rectangular block which is mounted flush to the top surface of the base 101 at one end of the base 101 extending across approximately one-half the length of the base 101. The first mobile member 103 of this first linear ball slide 103 is similarly of rectangular shape having a width which is greater than the width of the first stationary member 103a. Along the bottom side of the first mobile member 103b, a rectangular channel is cut such that the first stationary member 103a may be positioned within the channel as shown in FIG. 2. The sliding action of the first mobile member 103b on top of the first stationary member 103a is provided for by ball bearings (not shown) which are positioned within channels (not shown) along respective side surfaces of the first mobile member 103b and the first stationary member 103a. This ball bearing system and the corresponding channels along the respective side surfaces of the first mobile member 103b and the first stationary member 103a will be described in greater detail below with reference to FIGS. 3A and 3B.

A mounting plate 105 is attached so as to cover the top surface of the first mobile member 103b. The mounting plate 105 allows other structures and/or devices such as the second linear ball slide 109 or a tensile force gauge, for example, to be mounted on top of the first ball slide 103 with minimal holes and fasteners such as screws and rivets coming into direct contact with the first mobile member 103b which could hinder its operation.

The second linear ball slide 109 has the second stationary member 109a mounted on top surface of the mounting plate 105, at one end of the mounting plate 105, and the second mobile member 109b mounted so as to slidably engage the second stationary member 109a as shown in FIG. 2. The second linear ball slide 109 is simply a smaller version of the first linear ball slide which comprises the first stationary member 103a and the first mobile member 103b. Similarly with respect to the first linear ball slide, the second mobile member 109b of the second linear ball slide 109 slides on top of the second stationary member 109a by means of ball bearings which are positioned in channels (not shown) along respective side surfaces of the second stationary member 109a and the second mobile member 109b. This ball bearing system along with their corresponding channels along the respective side surfaces of the second linear ball slide 109 will be described in greater detail below with reference to FIGS. 3a and 3b.

Figure 3A:
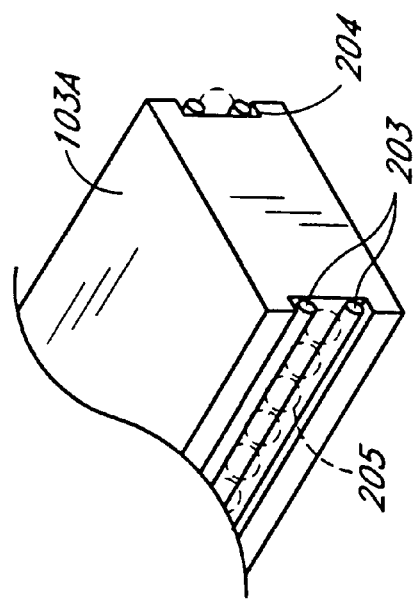
FIG. 3 is a cutaway perspective view of a preferred embodiment of a linear ball slide for use in the present invention, the linear ball slide having its mobile member disengaged from its stationary member.
Figure 3B:
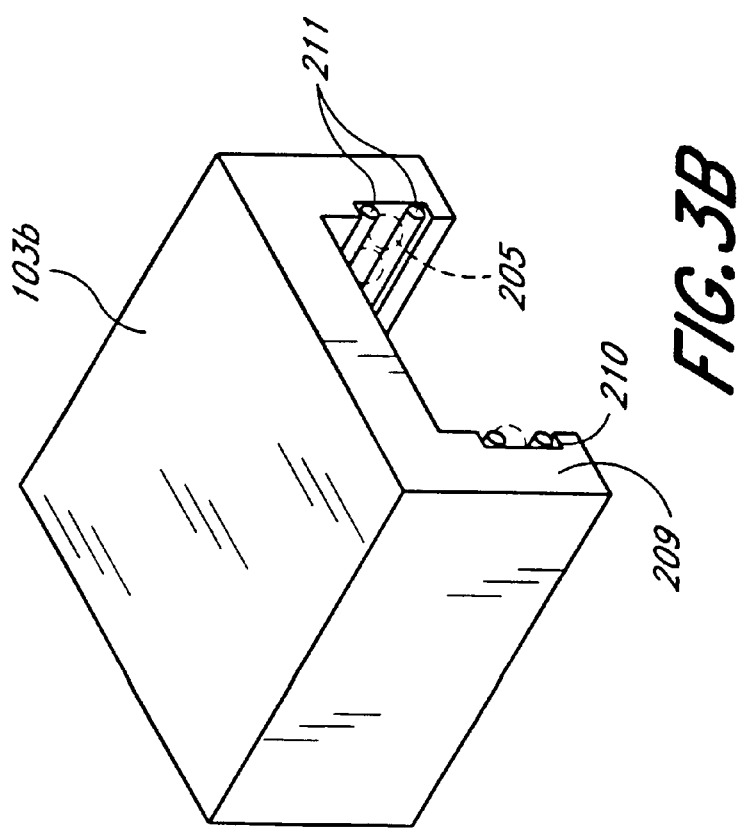
Figure 4:
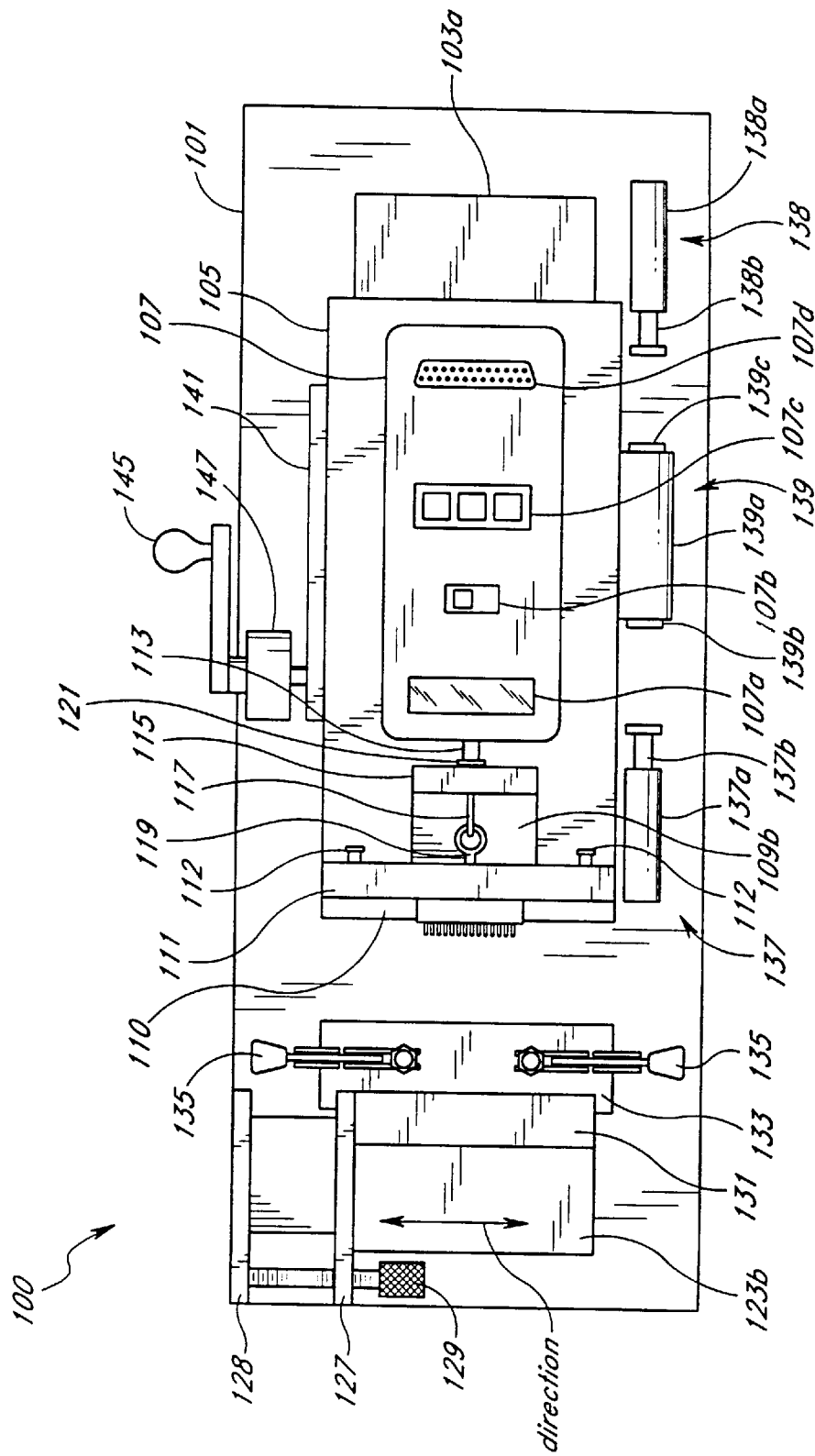
FIG. 4 is a top view plan of a preferred embodiment of the extraction force tester of FIG. 1.

Referring to FIGS. 3A and 3B, the linear ball slide 103 of FIGS. 1 and 2 is shown with the mobile member 103b (FIG. 3B) disengaged from the stationary member 103a (FIG. 3A). Although reference is made to only linear ball slide 103 in the following discussion, it should be understood that the structures and operating principles discussed below apply equally to the second linear ball slide 109 and also the third linear ball slide 123 which in the preferred embodiment are the same type of sliding apparatus as the first linear ball slide 103. The stationary member 103a has a channel 204 along the length of each of its sides and two steel rods 203 attached to the inside of each channel 204. The rods 203 are positioned and attached in their respective channels 204 in a parallel fashion along the length of both sides of stationary member 103a as shown in FIG. 3A. The parallel steel rods 203 form smooth guide rails along which a plurality of ball bearings 205 may "slide" or roll. As shown in FIG. 3B the first mobile member 103b also has a channel 210 along the inside length of each of its downwardly sides, extending and two steel rods 211 attached to and extending the length of channels formed on the inside of each side 209 of the first mobile member 103b. The steel rods 211 are positioned and attached inside their respective channels in a parallel fashion, thereby forming smooth guide rails along which multiple ball bearings 205 may "slide" or roll.

When the first mobile member 103b is slidably engaged on top of the first stationary member 103a, the plurality of ball bearings 205 ride in a channel formed by the four steel rods, two rods 203 being attached to each channel 210 along each side of the first stationary member 103a and two rods 211 being attached to each channel 210 along each inside surface of each side of the first mobile member 103b. The plurality of ball bearings 205 are common to both the first stationary member 103a and the first mobile member 103b and hold the first mobile member 103b from being vertically displaced from the first stationary member 103a. If an operator attempted to lift the first mobile member 103b vertically upward from the first stationary member 103a, the ball bearings 205, trapped within the "tunnel" formed by rods 203 and 211 and their respective channels 204 and 210, would prevent the mobile member 103b from being lifted vertically upward from stationary member 103a. Therefore, the first mobile member 103b may only move, or ride, on top of the first stationary member 103a such that it slides in a linear fashion in the direction of the length of the first stationary member 103a. The first mobile member 103b is coupled to the first stationary member 103a by means of the common ball bearings held within the tunnel formed by the parallel steel rods 203 and 211, inside channels 204 and 210, respectively, formed within each of the respective side surfaces. Therefore, there are no extraneous or additional surfaces between the first mobile member 103b and the first stationary member 103 which may cause additional friction and or tensile force during the sliding action.

By utilizing the linear ball slide above, the extraction force tester 100 of the present invention provides for smooth linear motion which is well suited for the measurement of tensile load associated with extracting pins from the sockets of a cable connector. Such linear ball slides are simple, linear motion devices which are well known in the art. In the preferred embodiment the linear ball slide is a Daedal Ball Slide which comprises a stationary base member with a mobile carriage riding on top. The bearing assemblies in each Daedal Ball Slide are factory pre-loaded to eliminate wobble and unwanted play in the system.

FIG. 4 shows a top view of the extraction force tester 100 of FIG. 1. Electronic tensile force gauge 107 is mounted on top of the mounting plate 105 which in turn is mounted onto the first mobile member 103b (not shown). As described above, the first mobile member 103b slidably engages with the first stationary member 103a which is mounted onto base 101. The electronic tensile force gauge 107 includes a display 107a for displaying the measured tensile force required to extract the pin assembly 110 from the sockets of a connector. In a preferred embodiment, the display 107a is a liquid crystal display which shows force readings in units of pounds (lbs).

As the tensile force gauge 107 is moved forward, to the left, the pin assembly 110 approaches the connector stage 133 upon which a cable connector may be fixed in position. As the electronic tensile force gauge 107 is moved forward, pin assembly 110 engages the sockets of a connector (not shown) placed and held on the connector stage 133 by means of the toggle clamps 135. The connector stage 133, which is mounted on the connector block 131, which in turn is mounted onto the third mobile member 123b, may be adjusted laterally such that the pins of the pin assembly 110 may be properly aligned with the sockets of the connector placed on the connector stage 133. As shown in FIG. 4, the lateral movement of the third mobile member 123b, and consequently the connector stage 133, is controlled by a vernier thumb screw 129 as described below. The third linear ball slide 123 is similar to the first and second linear ball slides described above. It has a third stationary member 123a mounted on the base 101 and a third mobile member 123b which slidably engages the third stationary member 123a. The operation of the third linear ball slide 123 is the same as that described for the first and second linear ball slides, 103, 109 and in the preferred embodiment the third linear ball slide 123 is also a Daedal Ball Slide.

However, as can be seen from FIG. 4, the third linear ball slide is mounted on the base 101 such that the linear motion of the third mobile member 123b is in a direction which is lateral to the direction of motion of the first and second mobile members, 103b and 109b. A vernier thumbscrew 129 has a shaft which is threadably received by a hole (not shown) of the slide wall 127 which is attached to the third mobile member 123b. The thumbscrew 129 is rotatably received at one end by the biasing wall 128 which holds the thumbscrew 129 in a laterally fixed position while allowing it to rotate. Therefore, as one rotates the thumbscrew 129 either clockwise or counterclockwise, the shaft of the thumbscrew 129 drives the slide wall 127 either toward or away from the biasing wall 128, thereby moving the third mobile member 123b. The thumbscrew 129 is a standard thumb screw which is well-known in the art and which is commercially available in most hardware stores.

By squaring a connector (not shown) placed on the connector stage 133 at right angles to the pin assembly 110 which is mounted on the second linear ball slide 109, the subsequent connection between the sockets of the connector and the pins of the pin assembly 110 will not be skewed. In addition, for the initial setup, a rough position of the female connector and pin assembly 110 can be achieved by turning the linear thumb screw 129 and thereby moving the third mobile member 123b transversely with respect to the linear path of the first and second linear ball slides, 103 and 109. The operator can thus visually line up the female connector with respect to the pin assembly 110 before engagement.

The extraction force tester 100 also includes a first stop 137 and a second stop 138 connected to the top surface of the base 101 as shown in FIG. 4. In a preferred embodiment, the first stop 137 and a second stop 138 each comprise a bracket 137a and 138a, respectively, which is mounted onto the base 101 along the length of the base 101, parallel and adjacent to the first mobile member 109b. Threaded into each bracket is a screw 137b and 138b, respectively, having a button head.

A slide stop 139 includes a bracket 139a which is mounted on the side of the first mobile member 103b. The bracket 139a of slide stop 139 includes a first head 139b connected to the front portion of the bracket 139a for engaging the button head of the first stop 137 and a second head 139c connected to the rear portion of the bracket 139a of slide stop 139 for engaging the button head of the second stop 138. The first and second heads 139b and 139c, of slide stop 139, are preferably made of a durable rubber or similar material which may absorb the shock as the first and second heads 139b, 139c of slide stop 139 hit the respective first and second stops 137 and 138.

The stop 139 is positioned such that when the first mobile member 103b is moved a certain distance forward, to the left (in FIG. 4), slide stop 139 will meet first stop 137 and thereby prevent the first mobile member 103b from moving further to the left. The second stop 138 limits the backward motion of the first mobile member 103b. When the first mobile member 103b is moved backward a certain distance, the slide stop 139 will meet the second stop 138 thereby preventing the first mobile member 103b from moving further backward, to the right. As can be appreciated, the slide stop 139 in conjunction with the first and second stops, 137 and 138, respectively, limits the travel of the electronic tensile force gauge 107 and the pin assembly 110.

Figure 5:
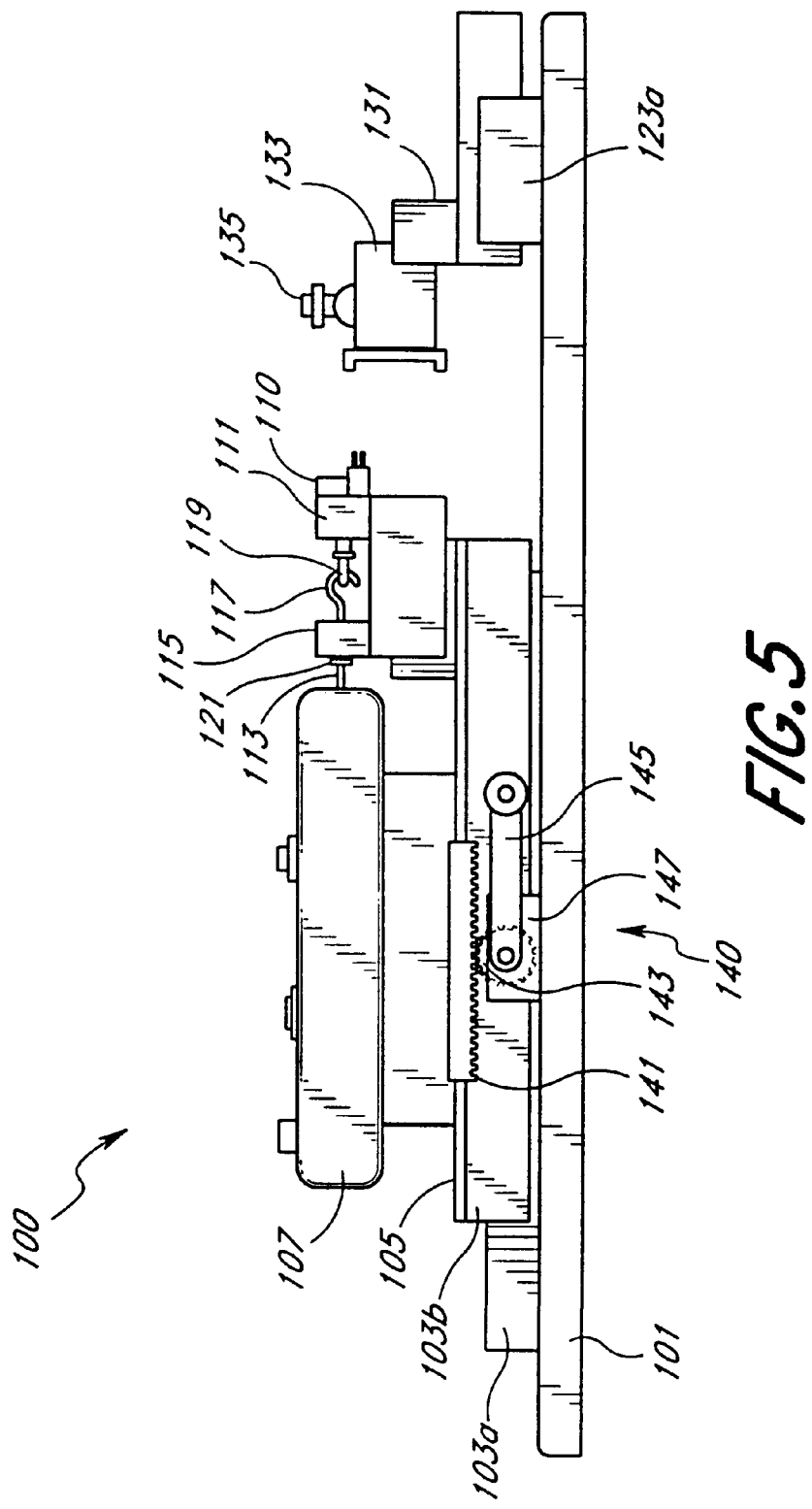
FIG. 5 is a right side, elevational view of the extraction force tester of FIG. 1 in which a rack and pinion system and corresponding lever are shown attached to the extraction force tester.

FIG. 5 shows a side elevational view of the extraction force tester 100 which is the opposite side to that shown in FIG. 1. As shown in FIG. 5, the extraction force tester 100 includes a rack and pinion system 140 for driving the first mobile member 103b which rides on top of the first stationary member 103a. The rack and pinion system 140 includes a rack 141 connected via screws, rivets or other suitable means to the side of the first mobile member 103a. The pinion gear 143 is connected at its axis of rotation to a lever 145 which may be rotated by a user a full 360 degrees around its rotation axis. When the rotation lever 145 is pulled or pushed, it rotates the pinion gear 143 and thereby moves the rack 141 and the first mobile member 103a. As can be appreciated, the lever 145 which is connected to the pinion gear 143 transforms the rotary motion of the pinion gear 143 into linear motion of the rack 141. Such rack and pinion systems are well-known in the art. As the lever is rotated clockwise, the first mobile member 103a will slide forward. As the lever 145 is rotated counterclockwise, the first mobile member 103b is moved backwards.

The rack and pinion system includes a Delrin block 147 that pinches the shaft connected to the pinion gear 143. The Delrin block 147 produces an additional friction drag between the Delrin block 147 and the base 101. When the attached lever 145 is pivoted by an operator, the first mobile member 103b supporting the electronic tensile force gauge 107 and pin assembly 110, moves toward a cable connector clamped onto connector stage 133. The friction drag allows for stable motion of the first mobile member 103b with respect to the base 101.

Figure 6:
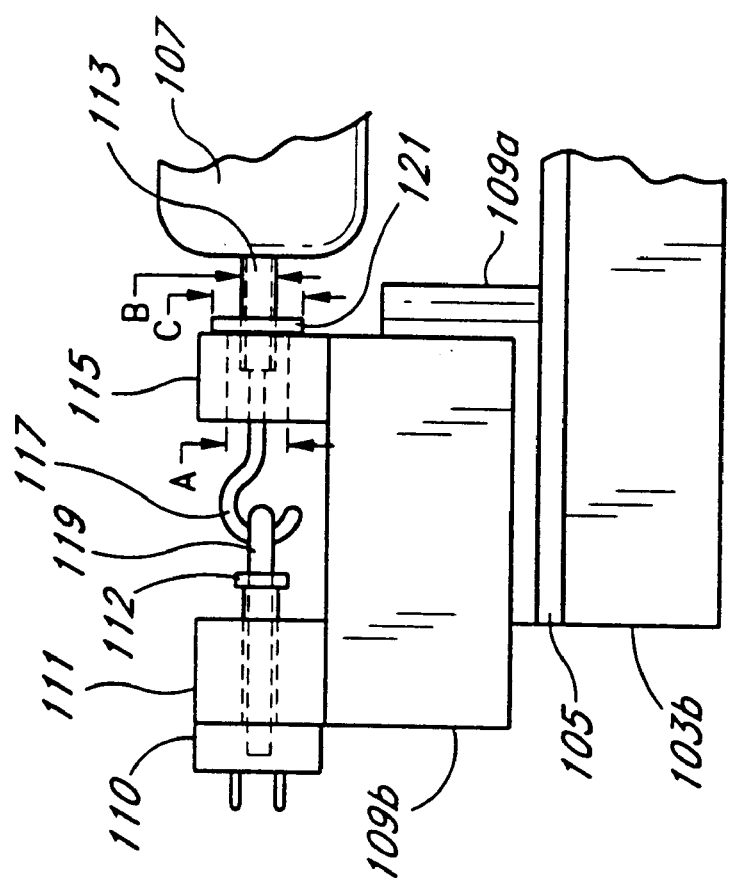
FIG. 6 is an enlarged cutaway right side elevational view of one embodiment of a coupling assembly portion of the extraction force tester illustrated in FIG. 1.

Referring to FIG. 6, a coupling assembly 120 for coupling the pin assembly 110 to the electronic tensile force gauge 107 can be described. The coupling assembly 120 is comprised of an eyelet 119 connected to the bracket 111 which in turn is mounted to the second mobile member 109b. The pin assembly 110 is adjustably connected to the bracket 111. Because there are a variety of cable connector designs, the orientation and position of the pins must be adjustable such that a given cable connector can make an acceptable connection with the pins of the pin assembly 110. Therefore, the pin assembly 110 is adjustably attached to the bracket 111 which allows the pin assembly 110 to float in position and center itself with the female connector as described below.

The bracket 111, as shown in FIG. 6, is mounted onto the top surface of the second mobile member 109b of the second linear ball slide 109 at one end of the second mobile member 109b. The pin assembly 110 is attached to the pin assembly bracket 111 by means of two thumbscrews 112. The thumbscrews 112 each pass through a respective hole (not shown) in bracket 111 and are threadably received by pin assembly 110. By rotating each respective thumbscrew 112, the horizontal, angular alignment of the pin assembly 110 may be adjusted. After the pins of pin assembly 110 have engaged the sockets of a connector, the two thumbscrews 112, located on the bracket 111, may be tightened to firmly hold the pin assembly 110 in alignment with the connector during subsequent testing.

A hook 117 extends through a hole A—A of coupling block 115 and hooks the eyelet 119. The hook 117 is threadably coupled at its opposite end to the sensor head 113 of the extraction force gauge 107. When the force gauge 107 is pulled back (toward the right in FIG. 6), the hook 117 pulls the eyelet 119 which in turn pulls the bracket 111 and pin assembly 110 away from the connector stage 133 (FIG. 1). The coupling block 115 in combination with the washer 121, also allows the force gauge 107 to push the second mobile member 109b and consequently the pin assembly 110, toward the connector stage 133, when the force gauge 107 is pushed forward as described below.

As seen in FIG. 6, the coupling block 115 is mounted on the top surface of the second mobile member 109b at an end opposite the bracket 111. The coupling block 115 has a hollow center portion with the diameter indicated by arrows A—A. The diameter of the center portion of coupling block 115 is greater than the diameter of the sensor head 113 of the electronic force gauge 107 such that when the electronic force gauge 107 is pulled back, e.g., moved to the right, the coupling block in no way impairs, or causes friction to the pulling of pin assembly 110. However, when extraction force gauge 107 is pushed forward to the left, washer 121 with the diameter indicated by arrows C—C pushes against coupling block 115 thereby pushing the second mobile member 109b. As can be appreciated, the diameter C—C of washer 121 is greater than the diameter of the hollow portion A—A of coupling block 115. This allows the washer to push upon the coupling block 115, thereby moving the second mobile member 109b, and consequently the pin assembly 110.

In the preferred embodiment, the washer 121 is a #10 washer which is commercially available in most hardware stores. This #10 washer is attached to the sensor head 113 of the electronic tensile force gauge 107. The #10 washer in conjunction with the hook 117, which is also attached to the sensor head 113, allows the force gauge 107 to both push the pin assembly 110 into a cable connector as well as pull the pin assembly 110 away from the connector. As was discussed above, the hook 117 connects to an eyelet 119 which is threaded into the bracket 111. The bracket 111 adjustably holds pin assembly 110 by means of the two thumb screws 112.

It should be appreciated that the coupling assembly described above allows the extraction force gauge 107 to measure the extraction force necessary to disengage the pins of the pin assembly 110 from the sockets of a connector with minimal extraneous forces. The only extraneous force that the extraction force gauge 107 must take into account is the friction between the second mobile member 109b against the second stationary member 109a as the second mobile member 109b slides back on top of the second stationary member 109a. As previously described, the linear ball slides used in the preferred embodiment of the present invention are designed to provide smooth, accurate, low friction sliding motion between the stationary base, e.g., 103a, and the top slide, e.g, 103b.

Therefore, the friction between the second mobile member 109b against the second stationary member 109a does not produce any significant unwanted pseudo forces which could lead to inaccurate tensile force readings. In addition when the pin assembly 110 is moved forward to engage the sockets of a connector, there is minimal tension in the coupling assembly due to the fact that washer 121 presses against the coupling block 115 in order to move the second mobile member 109b toward the connector. Therefore, the majority of the pressure and stress is absorbed between the washer 121 and the coupling block 115, thereby preventing wear and tear in the sensor head 113, the hook 117, and the eyelet 119.

Figure 7:
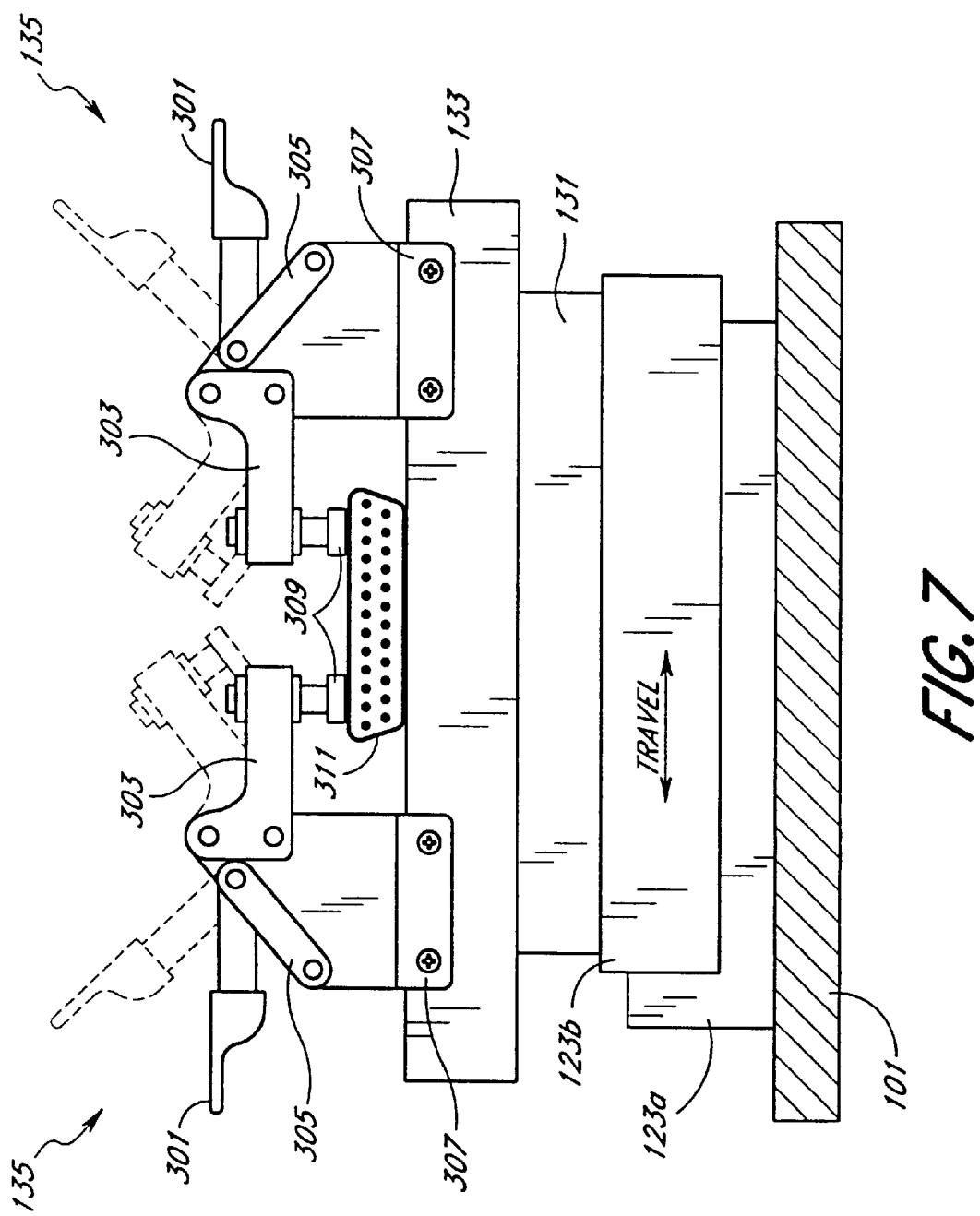
FIG. 7 is an elevational front view of one embodiment of a connector stage mounted onto a linear ball slide for holding a connector to be tested by the extraction force tester of the present invention.

FIG. 7 shows a front elevational view of a pair of toggle clamps 135 mounted onto the connector stage 133. The connector stage 133 is attached to the mounting block 131 which in turn is mounted onto the third mobile member 123b of the linear ball slide 123. The third mobile member 123b rides on top of the third stationary member 123a of the third linear ball slide 123. The third stationary member 123a is mounted onto the base 101 such that the third mobile member 123b slides in a linear fashion on top of the third stationary member 123a in a direction lateral to the direction of the first and second linear ball slides 103, 109 (motion is to the left and to the right as shown in FIG. 7).

The toggle clamps 135, shown in FIG. 7, are well known in the art and in the preferred embodiment are the series 206-SS manual toggle clamps, model 52047, manufactured by Austin Hardware, Incorporated. As shown in FIG. 7, each toggle clamp has an action lever 301 which toggles up and down to activate a pivoting member 303. In the down position of the action lever 301, the pivoting member 303 is also in the down, clamped position. The pivoting member 303 includes a clamping head 309 which, when in the down position, makes contact with a connector casing in order to clamp such connector by squeezing the connector down onto the top surface of the connector stage 133. The pivoting member 303 is connected to the action lever 301 by means of a spindle assembly 305. The spindle assembly 305 is connected to a clamp base 307 which is mounted onto the connector stage 133 as shown. Although the preferred embodiment utilizes toggle clamps 135 as shown in FIG. 7, other means of clamping or holding a connector onto a connector stage such that the connector is properly aligned and firmly held in position may be used. Such other means may include, for example, thumbscrews or other types of clamps which are well known in the art.

The present invention can also be characterized as a method for testing the cable spring force, otherwise known as the extraction force, of a cable connector by using an extraction force tester similar to that described above. This method includes the following steps:

1. Install a female cable connector onto the connector stage 133, positioning the connector against the adjustable azimuth control 136.
2. Adjust the azimuth control 136 such that the cable connector's sockets are vertically aligned and squared with a plurality of pins of pin assembly 110 such that the sockets may receive the plurality of pins of pin assembly 110.
3. Clamp the cable connector onto the connector stage 133 using the two toggle clamps 135.
4. Using the lever 145, position the first mobile member 103b so that the pins of pin assembly 110 are in close proximity but not engaging the female connector.
5. Position the third mobile member 123b using the linear vernier thumbscrew 129 to laterally align the female connector's sockets with the pins of pin assembly 110 such that its sockets may receive the pins of pin assembly 110.
6. Loosen the two thumbscrews 112, which secure the pin assembly 110 to the bracket 111, and partially engage the pins of pin assembly 110 into the sockets of the female connector.
7. Fully engage the twelve pins into the sockets and tighten both thumbscrews 112.
8. "Zero" the electronic gauge 107 by pushing its zero button.
9. Rotate lever 145 until the first mobile member 103b moves away from female connector.
10. Read the peak tensile force on the display 107a of the electronic gauge 107.
11. Record the peak tensile force reading.

As described above, it is thus seen that the extraction force tester of the present invention provides a fast and efficient means for testing the quality and reliability of various cable connectors. By using this extraction force tester, manufacturers of products, such as personal computers, which utilize cable connectors in the manufacture of their products, are provided with a standardized system for testing the quality and reliability of cable connectors. Therefore, such manufacturers may purchase cable connectors that have not been subject to pre-sale quality control testing and still be assured that the cable connectors that they are purchasing for their products meet required quality specifications.

While the invention herein disclosed has been described by means of specific embodiments and applications thereof, numerous modifications and variations could be made thereto by those skilled in the art without departing from the scope of the invention as set forth in the following claims.

What is claimed is:

1. An extraction force tester comprising:
   a base;
   a tensile force gauge, movably coupled to the base, which measures a force and provides an output indicative of the measured force;
   a pin assembly movably coupled to the base, the pin assembly having a plurality of pins for engaging a plurality of sockets of a connector; and a coupler which couples the pin assembly to the tensile force gauge, wherein the coupler allows the pin assembly to be pulled away from the connector by the force gauge so as to disengage the plurality of pins from the plurality of sockets, thereby enabling the force gauge to measure the extraction force necessary to disengage the plurality of pins from the plurality of sockets and, thereafter, provide an output indicative of the measured force.

2. The extraction force tester of claim 1 wherein said coupler further allows said pin assembly may be pushed toward said connector by said gauge, so as to engage said plurality of pins of said pin assembly in said plurality of sockets of said connector.

3. A pin assembly extraction force tester:

a tensile force gauge configured to be coupled to a first member so as to measure a force experienced by said first member and, thereafter, provide an output indicative of the measured force;

a support member configured to support a second member and to secure said second member in contact with said first member, wherein at least one of said force gauge and said support member is movable with respect to the other so as to produce a force between said first and second members.

4. The extraction force tester of claim 3 wherein said first member is a pin assembly and said second member is a connector.

5. The extraction force tester of claim 3 wherein said first member is a connector and said second member is a pin assembly.

6. The extraction force tester of claim 3 wherein said first member is movable with respect to said force gauge.

7. The extraction force tester of claim 3 further comprising a base wherein said force gauge and said first member are movably coupled to the base.

8. The extraction force tester of claim 7 wherein said support member and said second member are also movably coupled to said base.

9. A pin assembly extraction force tester comprising:

means, configured to be coupled to a first member of said pin assembly for measuring a tensile force experienced by said first member and providing an output indicative of the measured force; and means for supporting a second member and to secure said second member in contact with said first member, wherein at least one of said measuring means and said support means is movable with respect to the other so as to produce a tensile force between said first and second members.

10. The extraction force tester of claim 9 wherein said first member is movable with respect to said measuring means.

11. The extraction force tester of claim 9 further comprising a base wherein said measuring means and said first member are movably coupled to said base.

12. The extraction force tester of claim 11 wherein said support means and said second member are movably coupled to said base.

* * * * *

UNITED STATES PATENT AND TRADEMARK OFFICE
CERTIFICATE OF CORRECTION

PATENT NO. : 6,014,901
DATED : January 18, 2000
INVENTOR(S) : Boe

It is certified that error appears in the above-identified patent and that said Letters Patent is hereby corrected as shown below:

At [73], please delete "Boise" and insert therefore --Nampa--.

Signed and Sealed this

Fifteenth Day of May, 2001

Attest:

NICHOLAS P. GODICI

Attesting Officer    Acting Director of the United States Patent and Trademark Office